(12) United States Patent
Min et al.

(10) Patent No.: US 9,525,112 B2
(45) Date of Patent: Dec. 20, 2016

(54) METHOD OF MANUFACTURING PHOSPHOR FOR LIGHT-EMITTING DIODE

(71) Applicant: LIGHTIZER KOREA CO., Kangnam-ku (KR)

(72) Inventors: Jae Sik Min, Anyang (KR); Jae Young Jang, Anyang (KR); Byoung Gu Cho, Anyang (KR)

(73) Assignee: LIGHTIZER KOREA CO., Seoul (KR)

( * ) Notice: Subject to any disclaimer, the term of this patent is extended or adjusted under 35 U.S.C. 154(b) by 33 days.

(21) Appl. No.: 14/013,437

(22) Filed: Aug. 29, 2013

(65) Prior Publication Data

US 2014/0170788 A1 Jun. 19, 2014

(30) Foreign Application Priority Data

Dec. 13, 2012 (KR) ........................ 10-2012-0145177

(51) Int. Cl.
*H01L 33/52* (2010.01)
*H01L 33/00* (2010.01)

(52) U.S. Cl.
CPC ........... *H01L 33/52* (2013.01); *H01L 33/0095* (2013.01); *H01L 2933/0041* (2013.01)

(58) Field of Classification Search
None
See application file for complete search history.

(56) References Cited

U.S. PATENT DOCUMENTS

| 5,571,312 | A | * | 11/1996 | Andoe | 106/18.32 |
| 2009/0289545 | A1 | * | 11/2009 | Naum et al. | 313/503 |
| 2011/0089456 | A1 | * | 4/2011 | Andrews et al. | 257/98 |
| 2013/0244355 | A1 | * | 9/2013 | Chen et al. | 438/27 |
| 2013/0306911 | A1 | * | 11/2013 | Segawa et al. | 252/301.4 F |

FOREIGN PATENT DOCUMENTS

| KR | 1020080070193 A | 7/2008 |
| KR | 3020090026821 | 8/2010 |
| KR | 1011732510000 | 8/2012 |
| KR | 1020120019385 | 12/2012 |

* cited by examiner

*Primary Examiner* — Pamela E Perkins
(74) *Attorney, Agent, or Firm* — Hunter E. Webb; Keohane & D'Alessandro PLLC

(57) ABSTRACT

The present invention provides a method of manufacturing a phosphor for a light-emitting diode, including filling a phosphor frame in which phosphor models are formed in an engraving form with a fluorescent material solution including a fluorescent material that converts light provided by the light-emitting diode into white light by changing a wavelength of the light provided by the light-emitting diode, polishing a top surface of the phosphor frame filled with the fluorescent material solution, and drying the phosphor frame filled with the fluorescent material solution and polished.

5 Claims, 2 Drawing Sheets

METHOD OF MANUFACTURING PHOSPHOR FOR LIGHT-EMITTING DIODE

CROSS REFERENCE TO RELATED APPLICATION

This application claims the benefit of Korean Patent Application No. 10-2012-0145177 filed on Dec. 13, 2012, which is hereby incorporated by reference in its entirety into this application.

BACKGROUND OF THE INVENTION

1. Technical Field

The present invention relates to a method of manufacturing a phosphor for a light-emitting diode and, more particularly, to a method of manufacturing a phosphor which converts light provided by the light-emitting diode into white light by changing a wavelength of light emitted from the light-emitting diode.

2. Description of the Related Art

Recently, a light-emitting diode in which Al or In is added to GaN has been in the spotlight owing to a long lifespan, low power consumption, excellent brightness, and an eco-friendly element not harmful to the human body as compared with a conventional incandescent. In particular, a light-emitting diode providing white light has been further in the spotlight.

The light-emitting diode is being used in a vehicle illumination, a traffic signal lamp, and the Back Light Unit (BLU) of a liquid crystal display owing to the above-described advantages.

MacAdam's ellipse rule has recently been proposed as an index for evaluating whether a color coordinate measured at an artificial light source is identical with a color coordinate when being seen by an eye of a human being. MacAdam's ellipse rule provides a four-step criterion. In the United States, currently, an artificial light source that does not comply with three steps of MacAdam's ellipse rule is not allowed to be sold. In order to satisfy the three steps of MacAdam's ellipse rule, it is very important to reduce a color variance in white light.

Meanwhile, Korean Patent Laid-Open Publication No. 10-2008-0070193 discloses a phosphor light emitting diode and a method for manufacturing the same. However, the invention disclosed in the Korean Patent Laid-Open Publication is problematic in that a phosphor film is deteriorated because the phosphor film is attached by a thermal printing process. It has been known that this problem has a great defect in reliability that is most important in a white light light-emitting diode. Furthermore, there is a problem in that manufacturing expenses are increased when a fluorescent film is attached by a thermal printing process.

SUMMARY OF THE INVENTION

Accordingly, the present invention has been made keeping in mind the above problems occurring in the prior art, and an object of the present invention is to provide a method of manufacturing a phosphor for a light-emitting diode, which is capable of effectively suppressing the deterioration of the phosphor and also effectively reducing manufacturing expenses by simplifying a manufacture process.

Another object of the present invention is to provide a method of manufacturing a phosphor for a light-emitting diode, which is capable of reducing a light-emitting color variance in the phosphor and the light-emitting diode when the phosphors are arranged in the light-emitting diode.

Technical objects to be achieved by the present invention are not limited to the above-described objects and other technical objects that have not been described will be evidently understood by those skilled in the art from the following description.

In order to accomplish the above objects, a method of manufacturing a phosphor for a light-emitting diode in accordance with an embodiment of the present invention includes filling a phosphor frame in which phosphor models are formed in an engraving form with a fluorescent material solution including a fluorescent material that converts light provided by the light-emitting diode into white light by changing a wavelength of the light provided by the light-emitting diode, polishing a top surface of the phosphor frame filled with the fluorescent material solution, and drying the phosphor frame filled with the fluorescent material solution.

In the method of manufacturing a phosphor for a light-emitting diode in accordance with an embodiment of the present invention, filling the phosphor frame may include forming the phosphor models, formed of the plurality of engravings, in the phosphor frame and filling the phosphor models, formed of the engravings, with the fluorescent material solution.

In the method of manufacturing a phosphor for a light-emitting diode in accordance with an embodiment of the present invention, the fluorescent material solution may be formed of a mixture of phosphor, silicon, and a hardner.

In the method of manufacturing a phosphor for a light-emitting diode in accordance with an embodiment of the present invention, the hardness (Durometer Shore D) of the phosphor separated from the phosphor frame may be 25 to 75 after drying the polished phosphor frame.

In the method of manufacturing a phosphor for a light-emitting diode in accordance with an embodiment of the present invention, the hardness of the phosphor separated from the phosphor frame may be controlled by changing an addition ratio (wt %) of a hardner.

The method of manufacturing a phosphor for a light-emitting diode in accordance with an embodiment of the present invention may further include arranging the phosphors separated from the phosphor frame over the light-emitting diode and measuring a light-emission characteristic of the light-emitting diode and the phosphor, after drying the polished phosphor frame.

DETAILED DESCRIPTION

Figure 1:
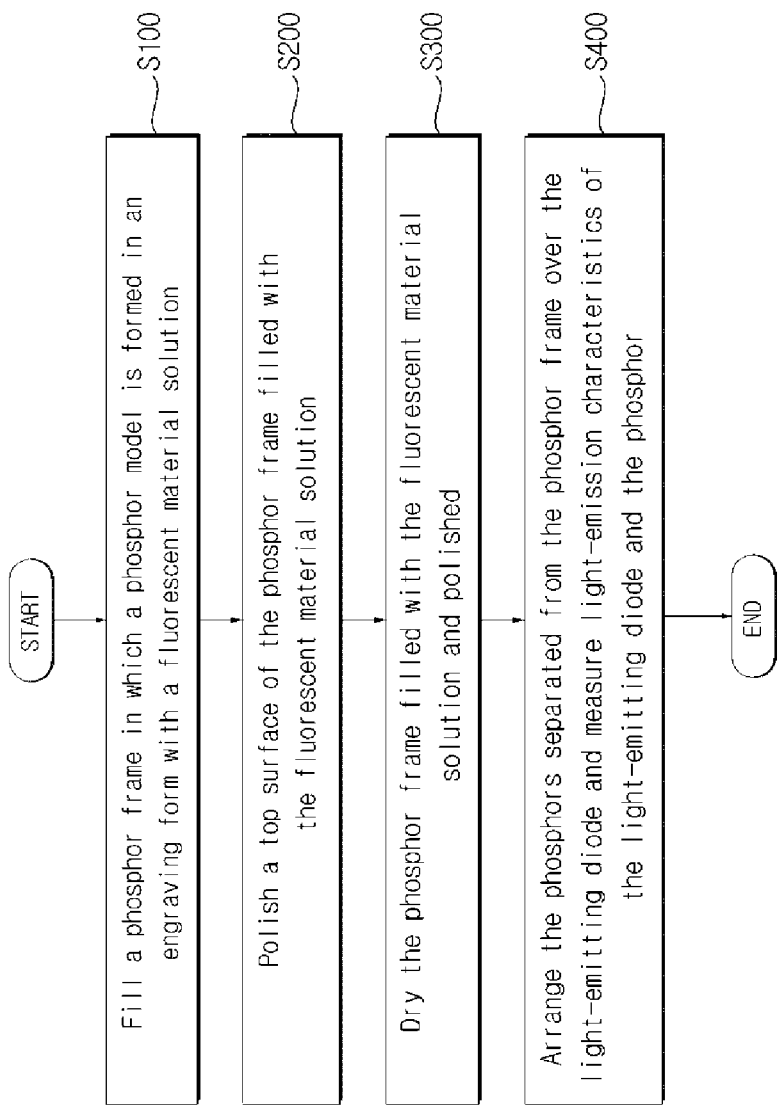
FIG. 1 is a process flowchart illustrating a method of manufacturing a phosphor for a light-emitting diode in accordance with an embodiment of the present invention.

Exemplary embodiments of the present invention are described in detail with reference to the accompanying drawings.

In a method of manufacturing a phosphor for a light-emitting diode in accordance with an embodiment of the present invention, first, a phosphor frame in which a phosphor model is formed in an engraving form is filled with a fluorescent material solution including a fluorescent material that converts light provided by the light-emitting diode into white light by changing a wavelength of the light provided by the light-emitting diode at step S100.

A plurality of the phosphor models is formed in the phosphor frame in the form of the engravings, and the phosphor models including the engravings are filled with the fluorescent material solution.

When filling the phosphor models formed of the engravings with the fluorescent material solution, the phosphor models preferably are filled with the fluorescent material solution to the extent that the fluorescent material solution overflows the phosphor models.

Next, a top surface of the phosphor frames filled with the fluorescent material solution is polished at step S200. When filling the phosphor models formed of the engravings preferably with the fluorescent material solution to the extent that the fluorescent material solution overflows the phosphor models and polishing the top surface of the phosphor frame as described above, the thickness of the fluorescent material solution filled in the phosphor models becomes conformable.

Accordingly, in the method of manufacturing a phosphor for a light-emitting diode in accordance with an embodiment of the present invention, a light-emitting color variance can be effectively reduced when the fabricated phosphors are disposed on the light-emitting diodes because the phosphors have a conformable thickness.

Next, the phosphor frame filled with the fluorescent material solution is dried by baking in a temperature of 150 degrees Celsius (° C.) to 200° C. for 30 to 100 minutes at step S300.

Here, after drying the polished phosphor frame, the hardness (Durometer Shore D) of the phosphor separated from the phosphor frame is about 25 to 75. The fluorescent material solution is formed of a mixture of phosphor, silicon, and a hardner. The hardness of the phosphor separated from the phosphor frame can be controlled by changing an addition ratio (wt %) of the hardner.

A range of the proposed phosphor was calculated by the inventor of the present invention by way of experiments. If the hardness is less than 25, there is a difficulty in a phosphor manufacturing process because the hardness is too small. If the hardness is greater than 75, a crack is generated in the phosphor because the hardness is too great, thus having an adverse effect on the quality and reliability of the light-emitting diode. The hardness of the phosphor is controlled by first selecting a silicon substance according to a hardness range of silicon and adjusting the amount of phosphor, silicon, and hardener. The hardness increases according to an increase in the amount of the hardener. Table shows process characteristics according to the hardness (Durometer Shore D) of the phosphor according to the present invention.

TABLE 1

| Hardness (shore D) | 10 | 25 | 50 | 75 | 90 |
|---|---|---|---|---|---|
| Type of silicon material | | | A | | |
| Type of phosphor material | | | a | | |
| Hardner addition ratio (wt %) | 0.5 | 1.0 | 2.0 | 3.0 | 3.5 |
| Mixture Ratio of silicon:phosphor | 1:1 | 1:1 | 1:1 | 1:1 | 1:1 |
| Process easiness (%) | 5 | 70 | 90 | 65 | 10 |
| Hardness (shore D) | 10 | 25 | 50 | 75 | 90 |
| Ratio of generated cracks (%) | 0 | 0 | 0 | 5 | 50 |
| Thickness uniformity (μm) | <50 μm | <10 μm | <10 μm | <5 μm | <5 μm |
| Bending (%) | 50 | 5 | 0 | 0 | 0 |
| Process yield (%) | 15 | 85 | 95 | 80 | 5 |

Figure 2:
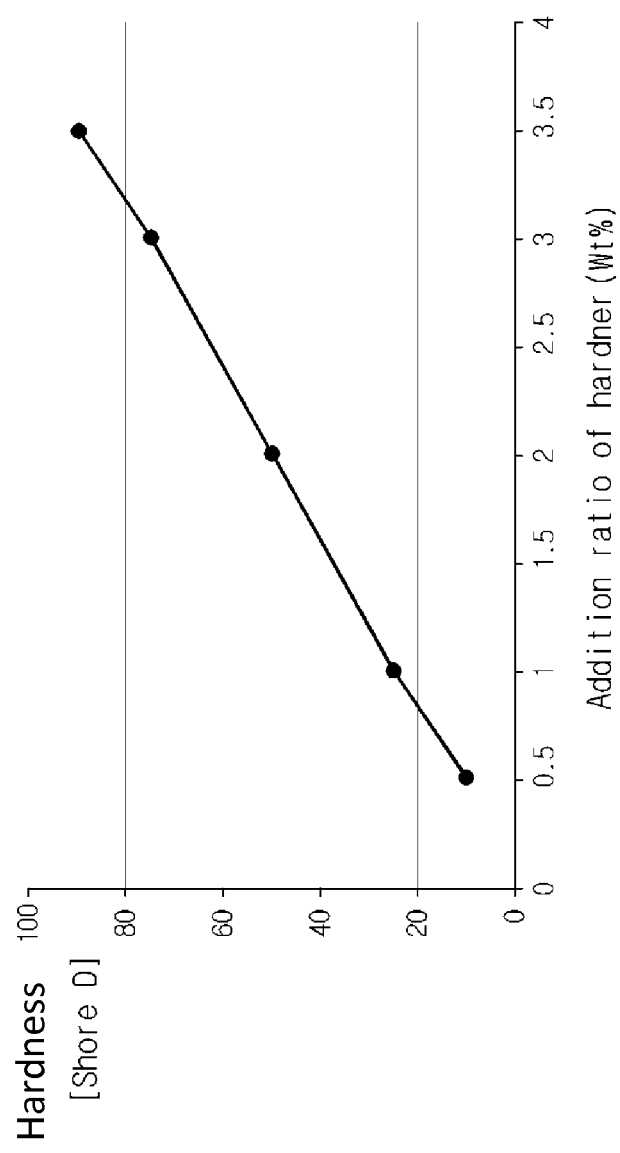
FIG. 2 is a graph showing a relationship between the hardness of a phosphor and an addition ratio of a hardner.

From Table 1, it can be seen that the hardness of the phosphor is 10 to 90. Silicon used in the experiments is a material used to convert white light of an LED. The phosphor inputted to the silicon is made of a yellow-series material used to convert a wavelength of light into a wavelength of white light in an LED. The phosphor is formed by a mixture of the phosphor and the silicon. In hardness dependency evaluation, all samples were experimented in the state in which a mixture ratio of the phosphor and the silicon is 1:1. The hardness of the phosphor is changed depending on a hardner. A hardner used in the experiments has a silica ($SiO_2$) particle and has a diameter of approximately 1 μm or less. The amount of the inputted hardner ranges from 0.5 wt % to 3.5 wt % based on a weight ratio. As the amount of the hardner increases, the hardness of the phosphor tends to increase directly. FIG. 2 shows a relationship between the hardness of the phosphor and an addition ratio of the hardner.

In terms of process ease, the best characteristics were achieved when the hardness was 50. It can be seen that when the hardness is 25 or lower or 75 or higher, process easiness suddenly decreases. This is because if the phosphor becomes soft or hard, it is very difficult to separate the phosphor from the phosphor frame after the dry process S300 is performed. In terms of the ratio of generated cracks, it can be seen that when the hardness is 75 or higher, about 50% of cracks are generated because the hardness rises. Accordingly, the hardness of the phosphor has to be limited to a maximum of or less. In terms of the thickness regularity of the phosphor, it shows that it is easy to secure a uniform thickness according to an increase in the hardness of the phosphor. This is because the molding of the phosphor is not maintained after the dry process S300 is performed if the phosphor is made of soft material due to low hardness. The bending characteristic of the phosphor has a similar tendency to the thickness uniformity of the phosphor. It shows that a process may not be easily applied to the phosphor having hardness of 25 or lower. The process yield is represented as a comprehensive process yield in which the aforementioned process ease, the ratio of generated cracks, the thickness regularity, and the bending characteristic are combined. It can be seen that the hardness of the phosphor is limited to 25 or higher to 75 or lower on the basis of the process yield of at least 80% or higher.

After drying the polished phosphor frame at step S300, the phosphors separated from the phosphor frame are arranged over the light-emitting diode and the light-emission characteristic of the light-emitting diode and the phosphor are measured at step S400.

If the step S400 is performed, the light-emission characteristic of the light-emitting diode and the phosphor can be measured before the phosphors are attached to the light-emitting diode. Accordingly, a light-emitting color variance can be reduced more effectively.

As described above, the method of manufacturing a phosphor for a light-emitting diode in accordance with the embodiments of the present invention can effectively suppress the deterioration of the phosphor due to heat because the phosphor is not attached by a thermal printing process.

Furthermore, the method of manufacturing a phosphor for a light-emitting diode in accordance with the embodiments of the present invention can effectively reduce a light-emitting color variance in the fabricated phosphor and the light-emitting diode because the fabricated phosphors have a conformable thickness.

Furthermore, in the method of manufacturing a phosphor for a light-emitting diode in accordance with the embodiments of the present invention, a crack is not generated in the phosphor when the phosphor is attached to the light-emitting diode, and the phosphor can be effectively arranged because the hardness (Durometer Shore D) of the phosphor ranges from 25 to 75.

Although the present invention has been described in connection with the preferred embodiments for illustrating the principle of the present invention, the present invention is not limited to the aforementioned constitutions and actions.

A person having ordinary skill in the art will appreciate that the present invention can be changed and modified in various manners without departing from the spirit and scope of the present invention.

Accordingly, all proper changes, modifications, and equivalents should be construed as belonging to the scope of the present invention.

What is claimed is:

1. A method of manufacturing a phosphor for a light-emitting diode (LED), the method comprising:
    filling a phosphor frame in which phosphor models are formed in an engraving form with a fluorescent material solution comprising a fluorescent material that converts light provided by the light-emitting diode into white light by changing a wavelength of the light provided by the light-emitting diode, wherein the phosphor models are filled with the fluorescent material solution to the extent that the fluorescent material solution overflows the phosphor models;
    adjusting a light-emitting-color to reduce a variance among individual model-formed phosphors in the phosphor frame by polishing a top surface of the phosphor frame filled with the fluorescent material solution to a conformable thickness;
    drying the phosphor frame filled with the fluorescent material solution; and
    separating each of the model-formed phosphors from the phosphor frame
    wherein hardness (Durometer Shore D) of the model-formed phosphor separated from the phosphor frame is 25 to 75 after drying the polished phosphor frame; and
    wherein the hardness of the model-formed phosphor separated from the phosphor frame is controlled by changing an addition ratio (wt %) of the hardner, and
    wherein a ratio of the phosphor to silicon in the model-formed phosphor is substantially 1:1.

2. The method of claim 1, wherein filling the phosphor frame comprises:
    forming the phosphor models, formed of the plurality of engravings, in the phosphor frame, and
    filling the phosphor models, formed of the engravings, with the fluorescent material solution.

3. The method of claim 1, wherein the flourescent material solution in the model-formed phosphor is formed of a mixture of phosphor, silicon, and a hardner.

4. The method of claim 1, further comprising:
    arranging the model-formed phosphors separated from the phosphor frame over the light-emitting diode;
    measuring a light-emission characteristic of the light-emitting diode and the model-formed phosphor, after drying the polished phosphor frame; and
    attaching the model-formed phosphor in a configuration that provides a desired light-emitting-color based on the measuring.

5. The method of claim 1, wherein the drying comprises baking in a temperature of 150° C. to 200° C. for 30 to 100 minutes.

* * * * *